US010020288B2

(12) United States Patent
Park et al.

(10) Patent No.: US 10,020,288 B2
(45) Date of Patent: Jul. 10, 2018

(54) SEMICONDUCTOR CHIPS INCLUDING REDISTRIBUTION INTERCONNECTIONS AND RELATED SEMICONDUCTOR PACKAGES

(71) Applicant: Samsung Electronics Co., Ltd., Suwon-si, Gyeonggi-do (KR)

(72) Inventors: Dong-Sik Park, Suwon-si (KR); Jung-Hoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/246,586

(22) Filed: Aug. 25, 2016

(65) Prior Publication Data

US 2017/0098630 A1 Apr. 6, 2017

(30) Foreign Application Priority Data

Oct. 6, 2015 (KR) .................. 10-2015-0140533

(51) Int. Cl.
*H01L 23/48* (2006.01)
*H01L 25/065* (2006.01)
(Continued)

(52) U.S. Cl.
CPC .......... *H01L 25/0657* (2013.01); *H01L 24/03* (2013.01); *H01L 24/05* (2013.01); *H01L 24/06* (2013.01); *H01L 25/50* (2013.01); *H01L 23/3128* (2013.01); *H01L 24/29* (2013.01); *H01L 24/32* (2013.01); *H01L 24/48* (2013.01); *H01L 24/73* (2013.01);
(Continued)

(58) Field of Classification Search
CPC ... H01L 2224/05567; H01L 2224/0557; H01L 21/76802; H01L 24/14; H01L 24/03–24/06; H01L 25/0657; H01L 2924/1436; H01L 2924/1438; H01L 2924/14
See application file for complete search history.

(56) References Cited

U.S. PATENT DOCUMENTS 6,853,090 B2 2/2005 Kim et al.
7,638,886 B2 12/2009 Shindo et al.
(Continued)

FOREIGN PATENT DOCUMENTS

JP H07-37949 A 2/1995
JP 4951276 B2 3/2012

*Primary Examiner* — A. Sefer
(74) *Attorney, Agent, or Firm* — Ward and Smith, P.A.

(57) ABSTRACT

A semiconductor chip is provided including an integrated circuit on a substrate; pads electrically connected to the integrated circuit; a lower insulating structure defining contact holes exposing the pads, respectively; and first, second and third conductive patterns electrically connected to the pads. The second conductive pattern is between the first conductive pattern and the third conductive pattern when viewed from a plan view. Each of the first to third conductive patterns includes a contact portion filling the contact hole, a first conductive line portion extending in one direction on the lower insulating structure, and a bonding pad portion. Ends of the bonding pad portions of the first and third conductive patterns protrude in the one direction as compared with an end of the bonding pad portion of the second conductive pattern when viewed from a plan view.

15 Claims, 12 Drawing Sheets

(51) Int. Cl.
  *H01L 23/00* (2006.01)
  *H01L 25/00* (2006.01)
  *H01L 23/31* (2006.01)
(52) U.S. Cl.
  CPC ........... *H01L 2224/04042* (2013.01); *H01L 2224/05548* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/48229* (2013.01); *H01L 2224/73215* (2013.01); *H01L 2224/73265* (2013.01); *H01L 2225/0651* (2013.01); *H01L 2225/06541* (2013.01); *H01L 2225/06565* (2013.01); *H01L 2924/14* (2013.01); *H01L 2924/1436* (2013.01); *H01L 2924/1438* (2013.01); *H01L 2924/15311* (2013.01)

(56) References Cited

U.S. PATENT DOCUMENTS

| | | |
|---|---|---|
| 7,901,958 B2 | 3/2011 | Okamoto et al. |
| 8,013,455 B2 | 9/2011 | Ahn et al. |
| 8,384,407 B2 | 2/2013 | Lim et al. |
| 2003/0153172 A1* | 8/2003 | Yajima ............... H01L 22/34 438/612 |
| 2005/0199995 A1* | 9/2005 | Nomoto ............... H01L 23/12 257/692 |
| 2006/0091535 A1 | 5/2006 | Tsao et al. |
| 2007/0158851 A1* | 7/2007 | Chanda ............. H01L 21/76846 257/774 |
| 2007/0164431 A1* | 7/2007 | Lee ..................... H01L 23/3114 257/737 |
| 2008/0054474 A1* | 3/2008 | Park .................. H01L 21/76802 257/762 |
| 2008/0185738 A1* | 8/2008 | Chung ............... H01L 23/3114 257/782 |
| 2009/0206493 A1* | 8/2009 | Pendse ............. H01L 23/49838 257/782 |
| 2010/0214728 A1* | 8/2010 | Aoyagi ................ G09G 3/20 361/679.01 |
| 2013/0320522 A1 | 12/2013 | Lai et al. |
| 2014/0042633 A1* | 2/2014 | Hong .................... H01L 24/03 257/773 |
| 2014/0084457 A1* | 3/2014 | Cho ........................ H01L 24/11 257/737 |
| 2014/0252611 A1* | 9/2014 | Chen ............... H01L 23/49816 257/738 |
| 2015/0206934 A1* | 7/2015 | Funaya .................. H01L 22/34 438/3 |
| 2015/0214145 A1* | 7/2015 | Lu ....................... H01L 23/3171 257/737 |
| 2015/0318265 A1* | 11/2015 | Isa ........................ H01L 25/065 257/777 |
| 2017/0098619 A1* | 4/2017 | Han ....................... H01L 24/02 |
| 2017/0098622 A1* | 4/2017 | Park ................... H01L 23/49811 |

* cited by examiner

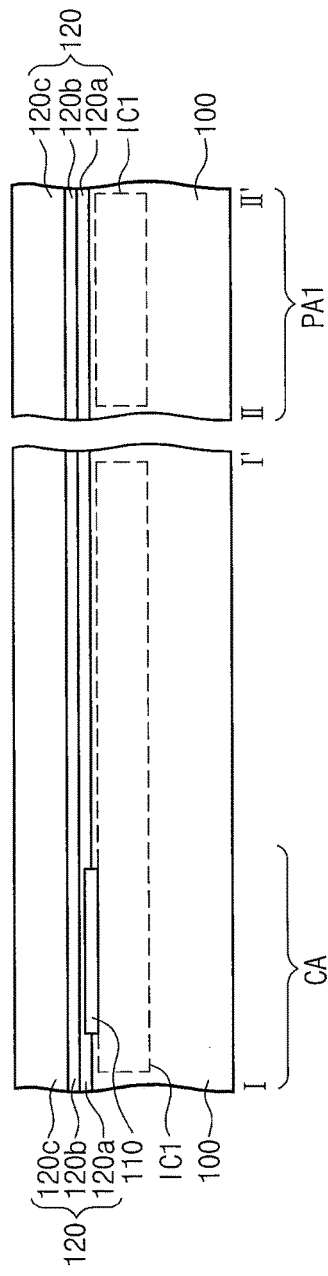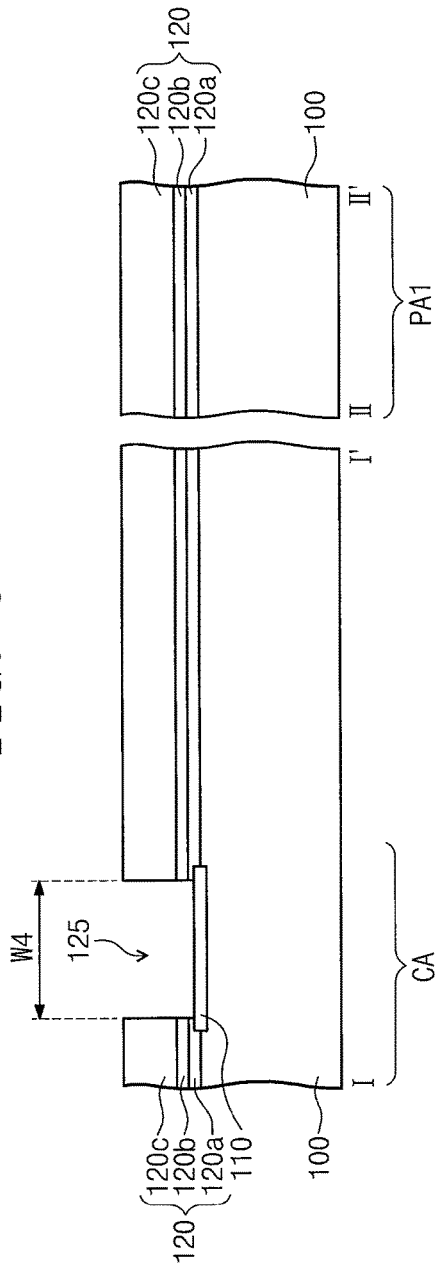

SEMICONDUCTOR CHIPS INCLUDING REDISTRIBUTION INTERCONNECTIONS AND RELATED SEMICONDUCTOR PACKAGES

CROSS-REFERENCE TO RELATED APPLICATION

This U.S. non-provisional patent application claims priority under 35 U.S.C. § 119 to Korean Patent Application No. 10-2015-0140533, filed on Oct. 6, 2015, in the Korean Intellectual Property Office, the disclosure of which is hereby incorporated herein by reference as if set forth in its entirety.

FIELD

Embodiments of the inventive concept relate to generally to semiconductors and, more particularly, to semiconductor chips and related fabrication methods and semiconductor packages.

BACKGROUND

Semiconductor devices are widely used in an electronic industry because of their small sizes, multi-functional characteristics, and/or low fabrication costs. Semiconductor devices may include semiconductor memory devices storing logical data, semiconductor logic devices processing logical devices, and hybrid devices performing various functions.

Semiconductor devices have been highly integrated with the development of the electronic industry. Thus, various problems, for example, margin reduction of an exposure process defining fine patterns, may make the manufacturing process for semiconductor devices difficult. Furthermore, high-speed semiconductor devices are in high demand. Much research has been conducted to satisfy these demands.

Meanwhile, as demand increases for high-capacity, thin and small semiconductor devices and electronic products, various packaging techniques relative thereto have been developed. According to one of the various packaging techniques, various semiconductor chips may be vertically stacked to realize a high-dense chip stack. According to this technique, semiconductor chips having various functions may be integrated in an area smaller than that of a general package having one semiconductor chip.

SUMMARY

Some embodiments of the inventive concept may provide a semiconductor chip including a redistribution interconnection formed using a deposition process and a patterning process. Related methods and semiconductor packages are also provided herein.

Further embodiments of the present inventive concept provide a semiconductor chip including an integrated circuit on a substrate; pads electrically connected to the integrated circuit; a lower insulating structure defining contact holes exposing the pads, respectively; and first, second and third conductive patterns electrically connected to the pads. The second conductive pattern is between the first conductive pattern and the third conductive pattern when viewed from a plan view. Each of the first to third conductive patterns include a contact portion filling the contact hole, a first conductive line portion extending in one direction on the lower insulating structure, and a bonding pad portion. The contact portion has a first thickness in a direction perpendicular to a top surface of the substrate, and a second thickness in a direction parallel to the top surface of the substrate. The first thickness may be greater than the second thickness. Ends of the bonding pad portions of the first and third conductive patterns protrude in the one direction as compared with an end of the bonding pad portion of the second conductive pattern when viewed from a plan view.

In still further embodiments, the bonding pad portions may be adjacent to one sidewall of the semiconductor chip. Distances from the one sidewall to the bonding pad portions of the first and third conductive patterns may be smaller than a distance from the one sidewall to the bonding pad portion of the second conductive pattern.

In some embodiments, the second conductive pattern may further include a second conductive line portion extending from the bonding pad portion in the one direction. The bonding pad portion of the second conductive pattern may be disposed between the first conductive line portion and the second conductive line portion of the second conductive pattern.

In further embodiments, the lower insulating structure may include a recess region formed in an upper portion thereof, and the recess region may not vertically overlap with the first to third conductive patterns.

In still further embodiments, a sidewall of the recess region may be aligned with a sidewall of each of the first to third conductive patterns, and a bottom surface of the recess region may be lower than a top surface of the lower insulating structure disposed under the first to third conductive patterns.

In some embodiments, the contact portion may fill the contact hole and may define a depressed region on the contact portion.

In further embodiments, the pads may be electrically connected to the integrated circuit through a plurality of metal layers and a plurality of vias, and the integrated circuit may be disposed under the plurality of metal layers and the plurality of vias.

In still further embodiments, the pads may be disposed in a central area of the semiconductor chip when viewed from a plan view, and the bonding pad portions of the first to third conductive patterns may be disposed in a peripheral area of the semiconductor chip when viewed from a plan view.

In some embodiments, the lower insulating structure may include a plurality of lower insulating layers sequentially stacked.

In further embodiments, each of the lower insulating layers may include a silicon nitride layer, a silicon oxide layer, or a silicon oxynitride layer.

In still further embodiments, the semiconductor chip may further include an upper insulating structure having first openings exposing the bonding pad portions of the first to third conductive patterns, respectively. The upper insulating structure may include an upper insulating layer covering the lower insulating structure and the first to third conductive patterns, and a polymer layer on the upper insulating layer.

In some embodiments, the upper insulating layer may directly cover top surfaces and sidewalls of the first to third conductive patterns.

In further embodiments, the upper insulating layer may include a silicon nitride layer, a silicon oxide layer, or a silicon oxynitride layer.

In still further embodiments, the polymer layer may include polyimide, fluorocarbon, resin, or synthetic rubber.

In some embodiments, the upper insulating structure may further have second openings exposing the contact portions of the first to third conductive patterns, respectively.

In further embodiments, the first to third conductive patterns may include aluminum (Al).

Still further embodiments of the present inventive concept provide a semiconductor chip including an integrated circuit on a substrate; pads electrically connected to the integrated circuit; a lower insulating structure defining contact holes exposing the pads, respectively; and conductive patterns electrically connected to the pads. Each of the conductive patterns include a contact portion filling the contact hole, a conductive line portion extending in one direction on the lower insulating structure, and a bonding pad portion. A top surface of a first region of the lower insulating structure is higher than a top surface of a second region of the lower insulating structure. The first region vertically overlaps with the conductive patterns. The second region is exposed by the conductive patterns. The bonding pad portions of the conductive patterns may be arranged in a zigzag pattern along one sidewall of the semiconductor chip adjacent to the bonding pad portions.

In some embodiments, the bonding pad portions may be arranged along the one sidewall of the semiconductor chip in a first direction to constitute a first row and a second row, and the first row and the second row may be spaced apart from each other in a second direction intersecting the first direction.

In further embodiments, the semiconductor chip may further include an upper insulating structure having openings exposing the bonding pad portions of the conductive patterns, respectively. The upper insulating structure may include an upper insulating layer covering the lower insulating structure and the conductive patterns, and a polymer layer on the upper insulating layer.

In still further embodiments, the upper insulating layer may directly cover the top surface of the second region.

In some embodiments, the semiconductor chip may further include barrier patterns disposed between the lower insulating structure and the conductive patterns, respectively. The conductive patterns may include aluminum (Al), and the barrier patterns may include titanium (Ti), titanium nitride (TiN), or a combination thereof.

Further embodiments of the present inventive concept provide a semiconductor package including a package substrate, and a semiconductor chip on the package substrate and electrically connected to the package substrate through wires. The semiconductor chip includes a first surface facing the package substrate; a second surface opposite to the first surface; pads adjacent to the second surface; a lower insulating structure defining contact holes exposing the pads, respectively; first, second and third conductive patterns electrically connected to the pads; each of the first to third conductive patterns including a contact portion filling the contact hole; a conductive line portion extending in one direction on the lower insulating structure and a bonding pad portion being in contact with the wire; and an upper insulating structure having openings exposing the bonding pad portions, respectively. The lower insulating structure includes a recess region formed in an upper portion of the lower insulating structure. The recess region does not vertically overlap with the first to third conductive patterns. The second conductive pattern is between the first conductive pattern and the third conductive pattern when viewed from a plan view, and ends of the bonding pad portions of the first and third conductive patterns protrude in the one direction as compared with an end of the bonding pad portion of the second conductive pattern when viewed from a plan view.

In still further embodiments, the upper insulating structure may include an inorganic insulating layer containing silicon and covering the lower insulating structure and the first to third conductive patterns, and a polymer layer on the inorganic insulating layer.

In some embodiments, the inorganic insulating layer may directly cover a sidewall and a bottom surface of the recess region.

In further embodiments, the semiconductor chip may further include an integrated circuit disposed in the semiconductor chip and electrically connected to the pads. The integrated circuit may be electrically connected to the package substrate through the pads, the first to third conductive patterns, and the wires.

In still further embodiments, the semiconductor chip may include a plurality of semiconductor chips sequentially stacked on the package substrate. In this case, each of the semiconductor chips may be electrically connected to the package substrate through the bonding pad portions and the wires.

Some embodiments of the present inventive concept provide methods for fabricating a semiconductor chip, the method including forming pads electrically connected to an integrated circuit on a substrate; forming a lower insulating structure covering the pads on an entire top surface of the substrate; patterning the lower insulating structure to form contact holes exposing the pads, respectively; forming a conductive layer filling the contact holes on the lower insulating structure; and patterning the conductive layer to form first to third conductive patterns extending in one direction on the lower insulating structure. Each of the first to third conductive patterns includes a bonding pad portion. The conductive layer is patterned such that ends of the bonding pad portions of the first and third conductive patterns protrude in the one direction as compared with an end of the bonding pad portion of the second conductive pattern when viewed from a plan view.

In further embodiments, the conductive layer may be formed using a physical vapor deposition (PVD) process. The conductive layer formed in each of the contact holes may have a first thickness in a direction perpendicular to a top surface of the substrate and a second thickness in a direction parallel to the top surface of the substrate. The first thickness may be greater than the second thickness.

In still further embodiments, the method may further include forming an upper insulating structure on the first to third conductive patterns, and patterning the upper insulating structure to form openings exposing the bonding pad portions of the first to third conductive patterns, respectively. The upper insulating structure may include an upper insulating layer covering the first to third conductive patterns, and a polymer layer on the upper insulating layer.

In some embodiments, the patterning of the conductive layer may include forming a recess region in an upper portion of the lower insulating structure. The recess region may not vertically overlap with the first to third conductive patterns.

In further embodiments, the conductive layer may include aluminum (Al). The patterning of the conductive layer may include forming a photoresist pattern on the conductive layer, and dry-etching the conductive layer using the photoresist pattern as an etch mask.

Still further embodiments provided methods for fabricating a semiconductor chip including a first integrated circuit, pads and a plurality of redistribution interconnections, the method including depositing a metal layer on a semiconductor substrate for the semiconductor chip; and patterning the metal layer to provide a plurality of redistribution interconnections for the semiconductor chip, the plurality of redistribution interconnections being connected to at least some of the pads. The pads are electrically connected to the first integrated circuit IC1 and the plurality of redistribution interconnections are on the pads.

In some embodiments, the plurality of redistribution interconnections may be formed to include bonding pad portions, the bonding pad portions being electrically connected to the first integrated circuit through the pads.

In further embodiments, the bonding pad portions of the plurality of redistribution interconnections may be arranged in a zigzag pattern.

In still further embodiments, the metal layer may be aluminum.

BRIEF DESCRIPTION OF THE DRAWINGS

The inventive concept will become more apparent in view of the attached drawings and accompanying detailed description.

FIGS. 5 to 9 are cross-sections taken along lines I-I' and II-II' of FIG. 2 illustrating processing steps in the fabrication of a semiconductor chip according to some embodiments of the inventive concept.

DETAILED DESCRIPTION OF THE EMBODIMENTS

Figure 1:
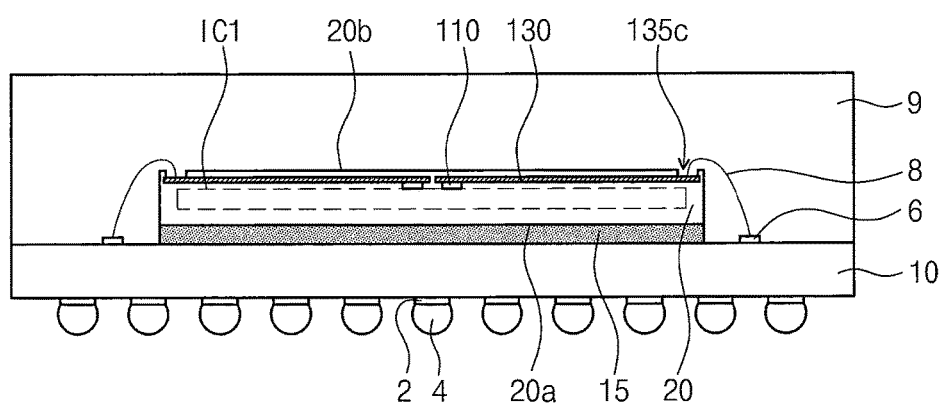
FIG. 1 is a cross-section illustrating a semiconductor package according to some embodiments of the inventive concept.

The inventive concept will now be discussed more fully hereinafter with reference to the accompanying drawings, in which exemplary embodiments of the inventive concept are shown. The inventive concept and methods of achieving the inventive concept will be apparent from the following exemplary embodiments that will be discussed in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be discussed with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes.

Exemplary embodiments of aspects of the present inventive concept explained and illustrated herein include their complementary counterparts. The same reference numerals or the same reference designators denote the same elements throughout the specification.

Figure 2:
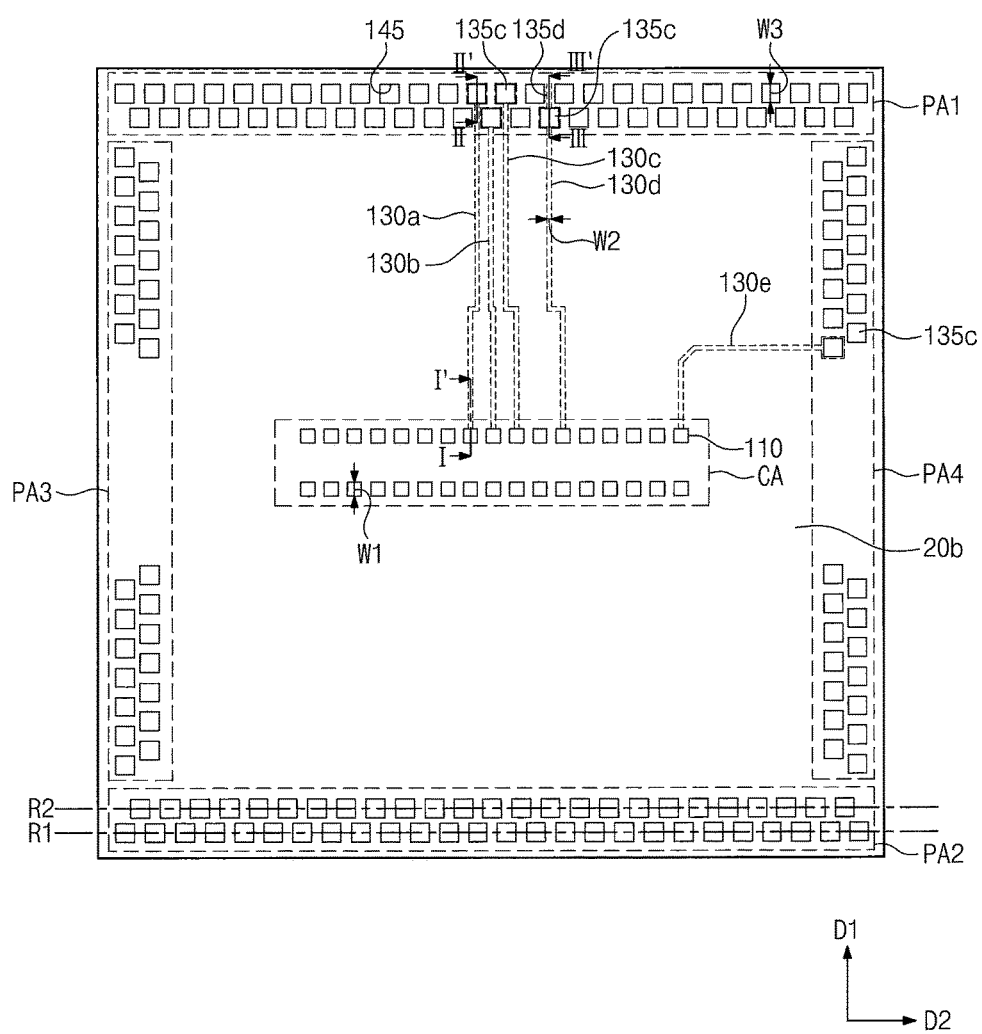
FIG. 2 is a plan view schematically illustrating a second surface of a first semiconductor chip according to some embodiments of the inventive concept.

FIG. 1 is a cross-section illustrating a semiconductor package according to some embodiments of the inventive concept. FIG. 2 is a plan view schematically illustrating a second surface of a first semiconductor chip according to some embodiments of the inventive concept.

Referring to FIGS. 1 and 2, a first semiconductor chip 20 may be mounted on a package substrate 10. For example, the package substrate 10 may be a printed circuit board (PCB). The package substrate 100 may include circuit patterns formed on top and bottom surfaces thereof. Some of the circuit patterns may be electrically connected to first external pads 2 formed on the bottom surface of the package substrate 10. External terminals 4, for example, solder bumps or solder balls, may adhere to the first external pads 2, respectively. The bottom surface 10 may be electrically connected to an external device through the external terminals 4. Others of the circuit patterns may be electrically connected to second external pads 6 formed on the top surface of the package substrate 10.

The first semiconductor chip 20 may include a first surface 20a facing the package substrate 10 and a second surface 20b opposite to the first surface 20a. The first semiconductor chip 20 may include a central area CA and first to fourth peripheral areas PA1, PA2, PA3, and PA4. The central area CA may be disposed at a central portion of the second surface 20b of the first semiconductor chip 20. The first to fourth peripheral areas PA1 to PA4 may be disposed to be adjacent to four sidewalls of the first semiconductor chip 20, respectively. In these embodiments, the first and second peripheral areas PA1 and PA2 may be disposed to be respectively adjacent to a pair of sidewalls, opposite to each other, of the first semiconductor chip 20. The third and fourth peripheral areas PA3 and PA4 may be disposed to be respectively adjacent to another pair of sidewalls, opposite to each other, of the first semiconductor chip 20. The central area CA may be surrounded by the first to fourth peripheral areas PA1 to PA4.

The first semiconductor chip 20 may include a first integrated circuit IC1, pads 110, and redistribution interconnections 130. In FIG. 2, first to fifth redistribution interconnections 130a to 130e connected to some of the pads 110 are illustrated as examples of the redistribution interconnections 130. However, embodiments of the inventive concept are not limited thereto. In other words, the first semiconductor chip 20 may further include other redistribution interconnections 130 connected to others of the pads 110 without departing from the scope of the present inventive concept.

The first integrated circuit IC1 may be formed in the first semiconductor chip 20 and may be adjacent to the second surface 20b. The pads 110 may be electrically connected to the first integrated circuit IC1. The pads 110 may be disposed in the central area CA when viewed from a plan view.

The first to fifth redistribution interconnections 130a to 130e may be disposed on the pads 110. The first to fifth redistribution interconnections 130a to 130e may include bonding pad portions 135c, respectively. The bonding pad portions 135c may be electrically connected to the first integrated circuit IC1 through the pads 110. The bonding pads 135c may be disposed in the first to fourth peripheral areas PA1 to PA4. The bonding pad portions 135c may be exposed outwardly. In other words, the first to fifth redistribution interconnections 130a to 130e may allow signals to be applied from the bonding pad portions 135c of the first to fourth peripheral areas PA1 to PA4 to the pads 110 of the central area CA.

FIG. 2 illustrates an example of the number and the arrangement of the pads 110 and the redistribution interconnections 130. However, the number and the arrangement of the pads 110 and the redistribution interconnections 130 according to the inventive concept are not limited to FIG. 2. In certain embodiments, the number and the arrangement of the pads 110 and the redistribution interconnections 130 may be altered according to a kind and/or a use of a semiconductor package without departing from the scope of the present inventive concept.

The first semiconductor chip 20 may be a memory chip, such as a dynamic random access memory (DRAM) chip or a flash memory chip. The first integrated circuit IC1 may include memory cells for storing data and a control circuit and/or power circuit for controlling operations of the memory cells.

The first semiconductor chip 20 may adhere to the package substrate 10 by a first adhesive layer 15 interposed therebetween. The first adhesive layer 15 may include an epoxy, a silicon-based insulating layer, or a tape.

Wires 8 may electrically connect the bonding pad portions 135c of the first semiconductor chip 20 to the second external pads 6 of the package substrate 10. The first semiconductor chip 20 may communicate with an external controller through the wires 8. Control signals, for example, address signals and command signals, a voltage signal, and write data may be provided from the external controller to the first semiconductor chip 20 through the wires 8. Data read out from the memory cells of the first semiconductor chip 20 may be provided to the external controller through the wires 8.

A molding layer 9 may be disposed on the package substrate 10 to cover the first semiconductor chip 20 and the wires 8. The molding layer 9 may protect the first semiconductor chip 20 and the wires 8 from external environment. The molding layer 9 may include an epoxy molding compound (EMC).

Figure 3A:
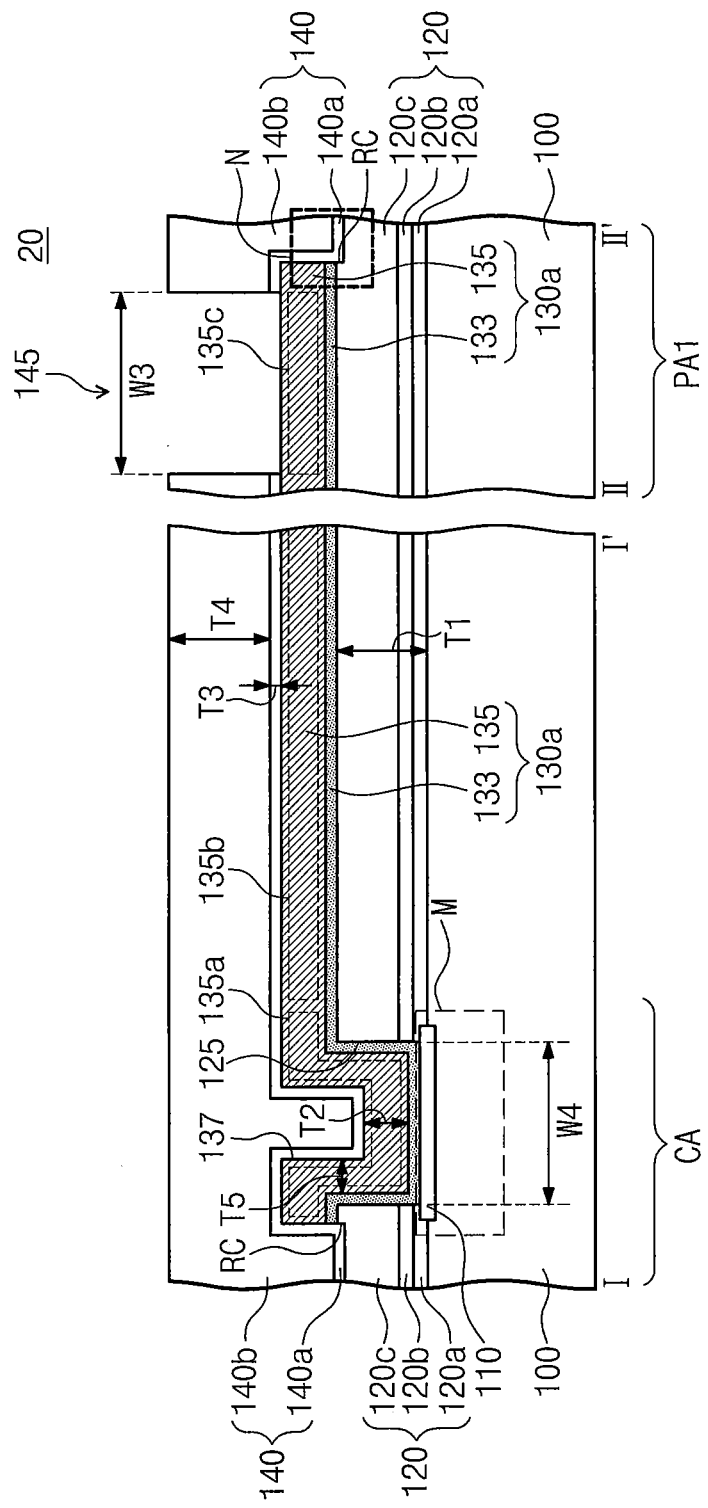
FIG. 3A is a cross-section taken along lines I-I' and II-II' of FIG. 2 illustrating a first semiconductor chip according to some embodiments of the inventive concept.
Figure 3B:
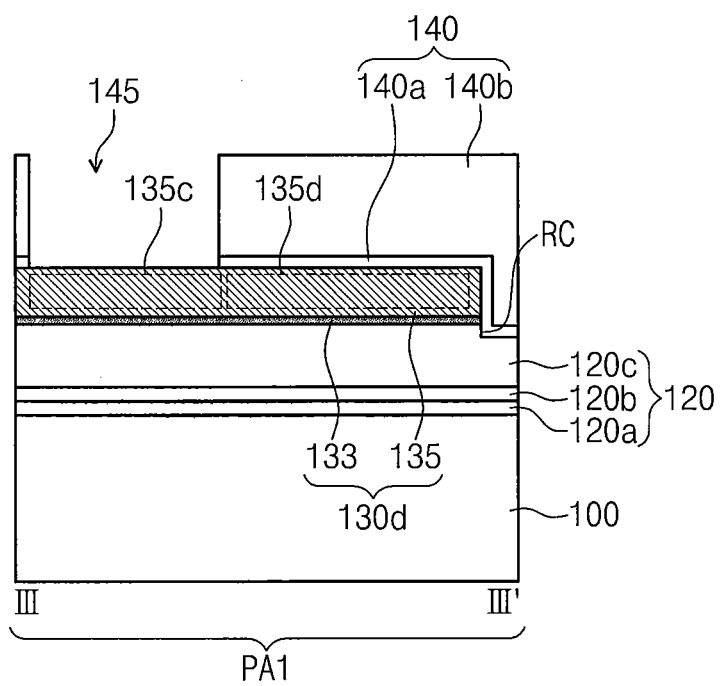
FIG. 3B is a cross-section taken along a line III-III' of FIG. 2 to illustrate a first semiconductor chip according to some embodiments of the inventive concept.
Figure 4A:
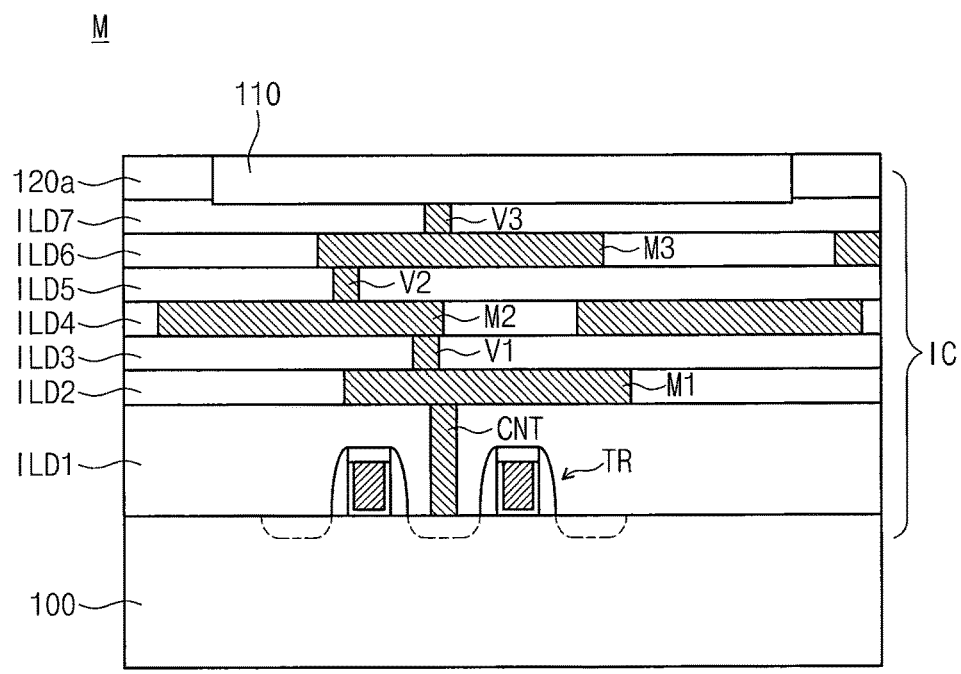
FIG. 4A is an enlarged cross-section of a region 'M' of FIG. 3.
Figure 4B:
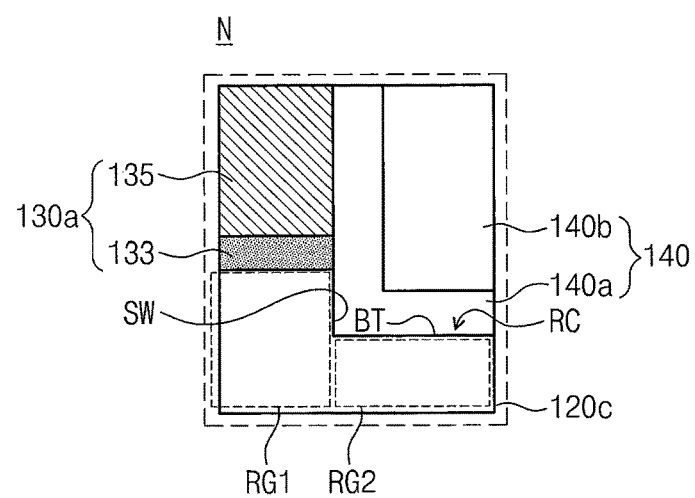
FIG. 4B is an enlarged cross-section of a region 'N' of FIG. 3.

FIG. 3A is a cross-section taken along lines I-I' and II-II' of FIG. 2 to illustrate a first semiconductor chip according to some embodiments of the inventive concept. FIG. 3B is a cross-section taken along a line III-III' of FIG. 2 to illustrate a first semiconductor chip according to some embodiments of the inventive concept. FIG. 4A is an enlarged cross-section of a region 'M' of FIG. 3. FIG. 4B is an enlarged cross-section of a region 'N' of FIG. 3. Hereinafter, the detailed descriptions to the same technical features as in the semiconductor package of FIGS. 1 and 2 will be omitted or mentioned briefly for the purpose of ease and convenience in explanation. The first semiconductor chip will be discussed in more detail.

Referring to FIGS. 2, 3A, 3B, 4A, and 4B, pads 110 may be disposed on a central area CA of a semiconductor substrate 100. The semiconductor substrate 100 may include, for example, a silicon substrate, a germanium substrate, or a silicon-germanium substrate. The pads 110 may be arranged in, but not limited to, two columns in the central area CA. The pads 110 may include a conductive material, such as aluminum (Al). At least one of the pads 110 may have a first width W1 in a first direction D1 parallel to a top surface of the semiconductor substrate 100. The first width W1 may range from 5 μm to 50 μm. One of the pads 110 will be mainly discussed hereinafter.

The pad 110 may be electrically connected to a first integrated circuit IC1 disposed in the first semiconductor chip 20. As illustrated in FIG. 4A, the first integrated circuit IC1 may be disposed on the semiconductor substrate 100. The first integrated circuit IC1 may include a plurality of transistors TR, a plurality of metal layers M1 to M3, and a plurality of vias V1 to V3.

Each of the transistors TR may include a gate electrode and dopant regions disposed at both sides of the gate electrode. The dopant regions may be disposed in the semiconductor substrate 100 and may be doped with dopants. The transistors TR may correspond to portions of memory cells or portions of a control circuit and/or power circuit for controlling operations of the memory cells.

First to seventh interlayer insulating layers ILD1 to ILD7 may be sequentially stacked on the semiconductor substrate 100. The first interlayer insulating layer ILD1 may cover the transistors TR. A contact CNT may penetrate the first interlayer insulating layer ILD1 so as to be connected to one of the dopant regions of the transistors TR.

A first metal layer M1, a second metal layer M2, and a third metal layer M3 may be disposed in the second interlayer insulating layer ILD2, the fourth interlayer insulating layer ILD4, and the sixth interlayer insulating layer ILD6, respectively. The pad 110 may be disposed on the seventh interlayer insulating layer ILD7. A first via V1 may be provided between the first and second metal layers M1 and M2, and a second via V2 may be provided between the second and third metal layers M2 and M3. A third via V3 may be provided between the third metal layer M3 and the pad 110. As a result, the pad 110 may be electrically connected to the transistors TR through the metal layers M1 to M3 and the vias V1 to V3.

Referring to FIGS. 2 and 3A, a lower insulating structure 120 may be disposed on an entire top surface of the semiconductor substrate 100. The lower insulating structure 120 may cover a portion of the pad 110. The lower insulating structure 120 may have a first thickness T1. In some embodiments, the first thickness T1 may range from 0.1 µm to 3 µm.

A contact hole 125 penetrating the lower insulating structure 120 may expose the rest portion of the pad 110. The contact hole 125 may have a fourth width W4 in the first direction D1. The fourth width W4 may be smaller than the first width W1. In some embodiments, the fourth width W4 may range from 5 µm to 50 µm.

The lower insulating structure 120 may include first, second and third lower insulating layers 120a, 120b, and 120c sequentially stacked. In other words, the second lower insulating layer 120b may be disposed between the first and third lower insulating layer 120a and 120c. A thickness of the third lower insulating layer 120c may be greater than that of the first lower insulating layer 120a. Furthermore, the thickness of the third lower insulating layer 120c may also be greater than that of the second lower insulating layer 120b.

Each of the first to third lower insulating layers 120a, 120b, and 120c may include an inorganic insulating layer such as a silicon nitride layer, a silicon oxide layer, or a silicon oxynitride layer. For example, each of the first and third lower insulating layers 120a and 120c may include a silicon oxide layer, and the second lower insulating layer 120b may include a silicon nitride layer. In some embodiments, the first semiconductor chip 20 may be a DRAM chip.

An upper portion of the lower insulating structure 120 may include a recess region RC. In other words, the third lower insulating layer 120c may include the recess region RC. The recess region RC may be disposed at each side of the first redistribution interconnection 130a when viewed from a plan view. In other words, the recess region RC may not vertically overlap with the first redistribution interconnection 130a. Furthermore, the recess region RC may not vertically overlap with other redistribution interconnections, for example, the second to fifth redistribution interconnections 130b to 130e, as well as the first redistribution interconnection 130a. In other words, a region of the lower insulating structure 120, which does not overlap with the redistribution interconnections 130a to 130e, may be recessed.

Referring to FIG. 4B, a bottom surface BT of the recess region RC may be disposed at a lower level than a top surface of the third lower insulating layer 120c disposed under the first redistribution interconnection 130a. An upper insulating layer 140a to be discussed later may directly cover a sidewall SW and the bottom surface BT of the recess region RC.

In other words, the lower insulating structure 120 may include a first region RG1 and a second region RG2. The first region RG1 may vertically overlap with the first redistribution interconnection 130a. The second region RG2 may vertically overlap with the recess region RC. In these embodiments, a top surface of the first region RG1 may be higher than a top surface of the second region RG2, for example, the bottom surface BT of the recess region RC.

The first redistribution interconnection 130a may be disposed on the lower insulating structure 120 and may fill the contact hole 125 so as to be electrically connected to the pad 110. Referring to FIG. 2, other redistribution interconnections, for example, the second to fifth redistribution interconnections 130b to 130e as well as the first redistribution interconnection 130a may also be disposed on the lower insulating structure 120.

One or some of the redistribution interconnections 130 may have line shapes extending in the first direction D1 when viewed from a plan view. Even though not shown in the drawings, another or others of the redistribution interconnections 130 may extend in a direction opposite to the first direction D1. Still another or others, for example, the fifth redistribution interconnection 130e, of the redistribution interconnections 130 may include a first portion extending in the first direction D1 and a second portion extending in a second direction D2 intersecting the first direction D1. Even though not shown in the drawings, yet another or others of the redistribution interconnections 130 may extend in a direction opposite to the second direction D2.

In other words, each of the redistribution interconnections 130 may include a portion extending from the central area CA to one of the first to fourth peripheral areas PA1 to PA4 such that end portions of the redistribution interconnections 130 may be uniformly distributed in the first to fourth peripheral areas PA1 to PA4.

At least one of the redistribution interconnections 130 may have a second width W2 in the second direction D2. In some embodiments, each of the redistribution interconnections 130 may be a signal line, a power line, or a ground line. Thus, widths of the redistribution interconnections 130 may be variously changed according to functions of the redistribution interconnections 130. In some embodiments, the second width W2 may range from 2 µm to 200 µm.

The first redistribution interconnection 130a among the redistribution interconnections 130 will now be discussed. In particular, the first redistribution interconnection 130a may include a barrier pattern 133 and a conductive pattern 135 on the barrier pattern 133. The barrier pattern 133 may be disposed between the lower insulating structure 120 and the conductive pattern 135. The barrier pattern 133 may vertically overlap with the conductive pattern 135. In some embodiments, a sidewall of the conductive pattern 135 may be aligned with a sidewall of the barrier pattern 133.

The barrier pattern 133 may reduce the likelihood that a metal material from being diffused from the conductive pattern 135 into the lower insulating structure 120. For example, the barrier pattern 133 may include, for example, titanium (Ti), titanium nitride (TiN), or a combination thereof. Furthermore, the barrier pattern 133 may improve wettability with the lower insulating structure 120 thereunder.

The conductive pattern 135 may include a contact portion 135a filling the contact hole 125, a first conductive line portion 135b extending in the first direction D1 on the lower insulating structure 120, and a bonding pad portion 135c. The contact portion 135a, the first conductive line portion 135b, and the bonding pad portion 135c may be connected to each other to constitute one body.

The contact portion 135a may have a second thickness T2 in a direction perpendicular to the top surface of the semiconductor substrate 100. Furthermore, the contact portion 135a may have a fifth thickness T4 from an inner sidewall of the contact hole 125 in the first direction D1 or the second direction D2. At this time, the second thickness T2 may be greater than the fifth thickness T5. In some embodiments, the second thickness T2 may range from 1 µm to 8 µm. A depressed region 137 may be defined by the contact portion 135a filling the contact hole 125.

The first conductive line portion 135b may be disposed between the contact portion 135a and the bonding pad portion 135c. Like the first redistribution interconnection 130a discussed above with reference to FIG. 2, the first conductive line portion 135b may have a line shape extending in the first direction D1 in some embodiments of the inventive concept. The bonding pad portion 135c disposed in the first peripheral area PA1 may be electrically connected to the contact portion 135a disposed in the central area CA through the first conductive line portion 135b.

The conductive pattern 135 may include a metal material capable of being formed by a deposition process and of being patterned by a patterning process. For example, the conductive pattern 135 may include aluminum (Al).

An upper insulating structure 140 may be disposed on the first redistribution interconnection 130a and the lower insulating structure 120. The upper insulating structure 140 may include an upper insulating layer 140a and a polymer layer 140b which are sequentially stacked. The upper insulating layer 140a may directly cover the first redistribution interconnection 130a. In some embodiments, the upper insulating layer 140a may directly cover a top surface and the sidewall of the conductive pattern 135 and the sidewall of the barrier pattern 133. Furthermore, as illustrated in FIG. 4B, the upper insulating layer 140a may directly cover the recess region RC of the third lower insulating layer 120c. In other words, the upper insulating layer 140a may directly cover the sidewalls SW and the bottom surface BT of the recess region RC.

The polymer layer 140b may be spaced apart from the first redistribution interconnection 130a with the upper insulating layer 140a interposed therebetween. The upper insulating structure 140 may protect the first redistribution interconnection 130a from external environment and may prevent an electrical short between the redistribution interconnections 130.

A first opening 145 may penetrate the upper insulating structure 140 to expose the bonding pad portion 135c. Referring to FIG. 2, the first opening 145 may be provided in plurality in the first to fourth peripheral areas PA1 to PA4, and the bonding pads 135c may be exposed through the first openings 145, respectively.

The first opening 145 may have a third width W3 in the first direction D1. The third width W3 may be greater than the fourth width W4. The third width W3 may have a suitable size such that a wire bonding process is easily performed on the bonding pad portion 135c. For example, the third width W3 may range from 100 µm to 300 µm.

The upper insulating layer 140a may be an inorganic insulating layer including silicon. For example, the upper insulating layer 140a may include at least one of, for example, a silicon nitride layer, a silicon oxide layer, or a silicon oxynitride layer. However, in some embodiments, the polymer layer 140b may be an organic insulating layer. For example, the polymer layer 140b may include polyimide, fluorocarbon, resin, or synthetic rubber. The upper insulating layer 140a may have a third thickness T3, and the polymer layer 140b may have a fourth thickness T4. The fourth thickness T4 may be greater than the third thickness T3. For example, the third thickness T3 may range from 0.1 µm to 3 µm, and the fourth thickness T4 may range from 0.3 µm to 6 µm.

Hereinafter, planar arrangement relation of the bonding pad portions 135c of the redistribution interconnections 130 will be discussed. First, the first to third redistribution interconnections 130a, 130b, and 130c will be discussed as an example.

Referring again to FIG. 2, ends of the bonding pad portions 135c of the first and third redistribution interconnections 130a and 130c may protrude in the first direction D1, compared with an end of the bonding pad portion 135c of the second redistribution interconnection 130b. The first semiconductor chip 20 may have one sidewall adjacent to the first peripheral area PA1. In these embodiments, distances from the one sidewall to the ends of the bonding pad portions 135c of the first and second redistribution interconnections 130a and 130c may be smaller than a distance from the one sidewall to the end of the bonding pad portion 135c of the second redistribution interconnection 130b.

In other words, the bonding pad portions 135c of each of the first and second peripheral areas PA1 and PA2 may be arranged in a zigzag pattern along the second direction D2. The bonding pad portions 135c of each of the third and fourth peripheral areas PA3 and PA4 may be arranged in a zigzag pattern along the first direction D1. For example, the bonding pad portions 135c of the second peripheral area PA2 may constitute a first row R1 and a second row R2 which are parallel to the second direction D2. The second row R2 may be spaced apart from the first row R1 in the first direction D1, and the bonding pad portions 135c of the first and second rows R1 and R2 may be arranged in the zigzag pattern along the second direction D2.

According to some embodiments of the inventive concept, the bonding pad portions 135c may be arranged in the zigzag pattern. A density of the bonding pads portions 135c arranged in the zigzag pattern may be higher than that of bonding pad portions arranged in a line. As a result, even though an area of the semiconductor chip is reduced by high integration density, the bonding pad portions 135 may be arranged in the zigzag pattern to place a large number of the redistribution interconnections 130 and the bonding pad portions 135c corresponding thereto in the reduced area of the semiconductor chip.

Referring again to FIGS. 2 and 3B, the fourth redistribution interconnection 130d may further include a second conductive line portion 135d extending from the bonding pad portion 135c in the first direction D1. Thus, the bonding pad portion 135c of the fourth redistribution interconnection 130d may be disposed between the first conductive line portion 135b and the second conductive line portion 135d of the fourth redistribution interconnection 130d. The upper insulating structure 140 may cover the second conductive line portion 135d, and thus, the second conductive line portion 135d may not be exposed outwardly. Similarly, the second redistribution interconnection 130b may further include the second conductive line portion 135d.

The second conductive line portion 135d may be disposed between a pair of bonding pad portions 135c adjacent thereto when viewed from a plan view. Thus, a parasitic capacitance between the pair of bonding pad portions 135c may be reduced by the second conductive line portion 135d.

FIGS. 5 to 9 are cross-sections taken along lines I-I' and II-II' of FIG. 2 to illustrate processing steps in the fabrication of a first semiconductor chip according to some embodiments of the inventive concept.

Referring to FIGS. 2 and 5, a first integrated circuit IC1 may be formed on a semiconductor substrate 100. The first integrated circuit IC1 may include a plurality of transistors TR, a plurality of metal layers M1 to M3, and a plurality of vias V1 to V3. The transistors TR, the metal layers M1 to M3, and the vias V1 to V3 may be the same as discussed with reference to FIG. 4A.

Pads 110 may be formed on the first integrated circuit IC1 of a central area CA of the semiconductor substrate 100. The pads 110 may be electrically connected to the first integrated circuit IC1. Hereinafter, one of the pads 110 will be mainly discussed.

A lower insulating structure 120 may be formed to cover the pad 110. Forming the lower insulating structure 120 may include sequentially forming a first lower insulating layer 120a, a second lower insulating layer 120b, and a third lower insulating layer 120c on an entire top surface of the semiconductor substrate 100. Each of the first to third lower insulating layers 120a, 120b, and 120c may be formed using an atomic layer deposition (ALD) process or a chemical vapor deposition (CVD) process. In some embodiments, each of the first and third lower insulating layers 120a and 120c may be formed of a silicon oxide layer, and the second lower insulating layer 120b may be formed of a silicon nitride layer. The lower insulating structure 120 may be formed to have a first thickness T1. In some embodiments, the first thickness T1 may range from 0.1 μm to 3 μm.

Referring to FIGS. 2 and 6, the lower insulating structure 120 may be patterned to form a contact hole 125 exposing the pad 110. Patterning the lower insulating structure 120 may include forming a first photoresist pattern having an opening vertically overlapping with the pad 110, and etching the lower insulating structure 120 using the first photoresist pattern as an etch mask. The contact hole 125 may have a fourth width W4. In some embodiments, the fourth width W4 may range from 5 μm to 50 μm.

Figure 7:
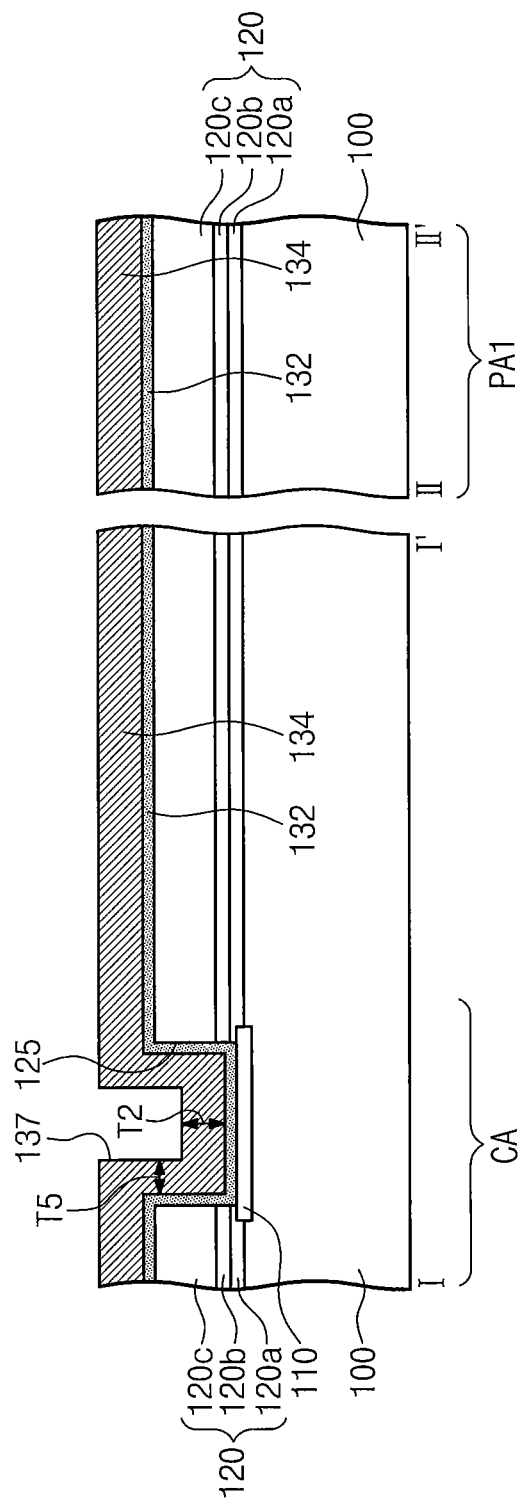

Referring to FIGS. 2 and 7, a barrier layer 132 and a conductive layer 134 may be sequentially formed on an entire top surface of the lower insulating structure 120. The barrier layer 132 and the conductive layer 134 may fill the contact hole 125. In other words, the barrier layer 132 may directly cover the pad 110. The conductive layer 134 may not completely fill the contact hole 125. Thus, a depressed region 137 may be defined by the conductive layer 134. The depressed region 137 may overlap with the contact hole 125.

Each of the barrier layer 132 and the conductive layer 134 may be formed using a physical vapor deposition (PVD) process. The conductive layer 134 on a bottom surface of the contact hole 125 may have a second thickness T2 in a direction perpendicular to a top surface of the semiconductor substrate 100. The conductive layer 134 on an inner sidewall of the contact hole 125 may have a fifth thickness T5 in the first direction D1 or the second direction D2. Since the conductive layer 134 is formed by the PVD process having a poor step coverage property, the second thickness T2 may be greater than the fifth thickness T5.

For example, the barrier layer 132 may be formed of a metal material including, for example, titanium (Ti), titanium nitride (TiN), or a combination thereof. For example, the conductive layer 134 may be formed of a metal material including aluminum (Al).

Figure 8:
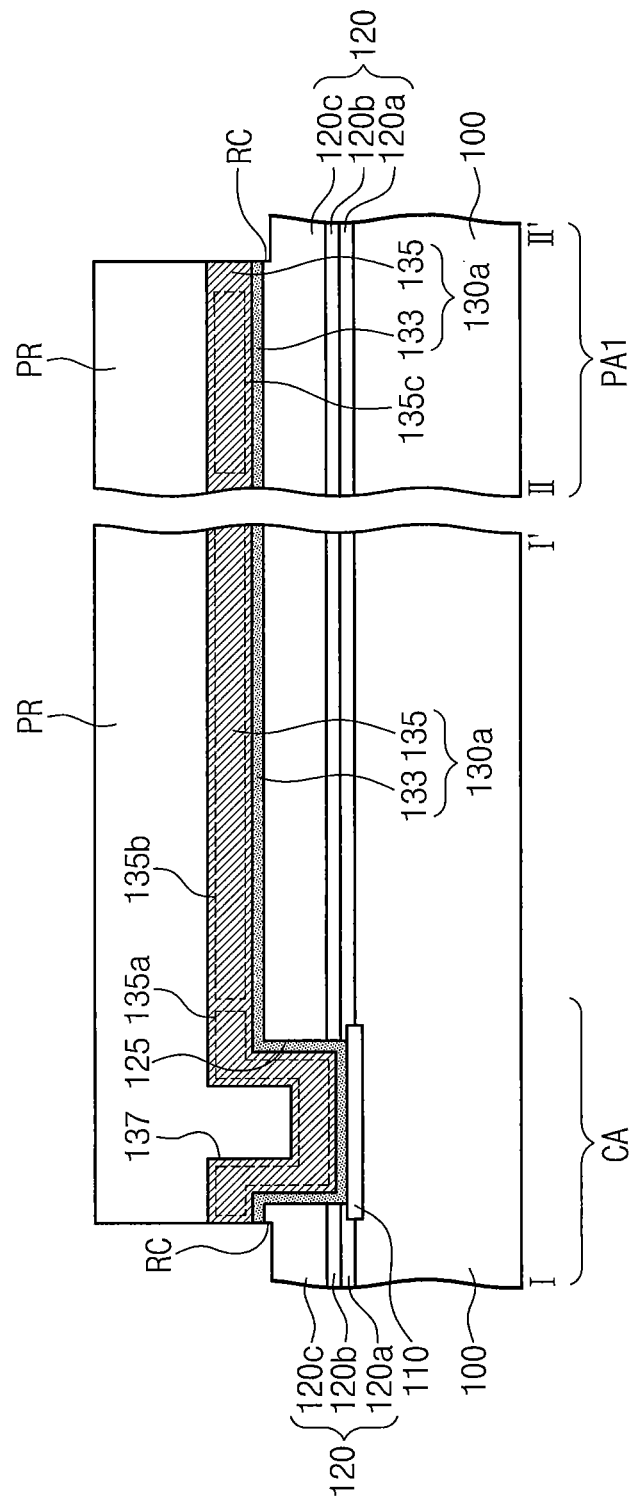

Referring to FIGS. 2 and 8, a second photoresist pattern PR may be formed on the conductive layer 134. The second photoresist pattern PR may be provided in plurality. The second photoresist patterns PR may be superimposed on the redistribution interconnections 130 discussed above with reference to FIGS. 2 and 3, respectively.

The conductive layer 134 and the barrier layer 132 may be sequentially etched using the second photoresist pattern PR as an etch mask to form a first redistribution interconnection 130a. The etching process of the conductive layer 134 and the barrier layer 132 may be performed using a dry etching process. For example, BCl₃ and/or SF₆ may be used as an etch gas of the dry etching process. However, embodiments of the inventive concept are not limited thereto. The first redistribution interconnection 130a may include a barrier pattern 133 and a conductive pattern 135 on the barrier pattern 133. The conductive pattern 135 may include a contact portion 135a, a first conductive line portion 135b, and a bonding pad portion 135c.

Since the conductive pattern 135 and the barrier pattern 133 are formed using the second photoresist pattern PR as the etch mask, the conductive pattern 135 and the barrier pattern 133 may vertically overlap with each other. Thus, a sidewall of the conductive pattern 135 may be aligned with a sidewall of the barrier pattern 133.

Furthermore, a portion of an upper portion of the lower insulating structure 120 may also be etched in the etching process of the conductive layer 134 and the barrier layer 132. In other words, the conductive layer 134 and the barrier layer 132 exposed by the second photoresist pattern PR may be removed to expose a portion of the third lower insulating layer 120c, and the exposed portion of the third lower insulating layer 120c may be then etched by over-etching. As a result, a recess region RC may be formed in the third lower insulating layer 120c by the etching process of forming the first redistribution interconnection 130a. A bottom surface of the recess region RC may be lower than a top surface of the third lower insulating layer 120c disposed under the first redistribution interconnection 130a.

In some embodiments of the inventive concept, etching the conductive layer 134 and the barrier layer 132 may include forming bonding pad portions 135c arranged in a zigzag pattern, as illustrated in FIG. 2.

Figure 9:
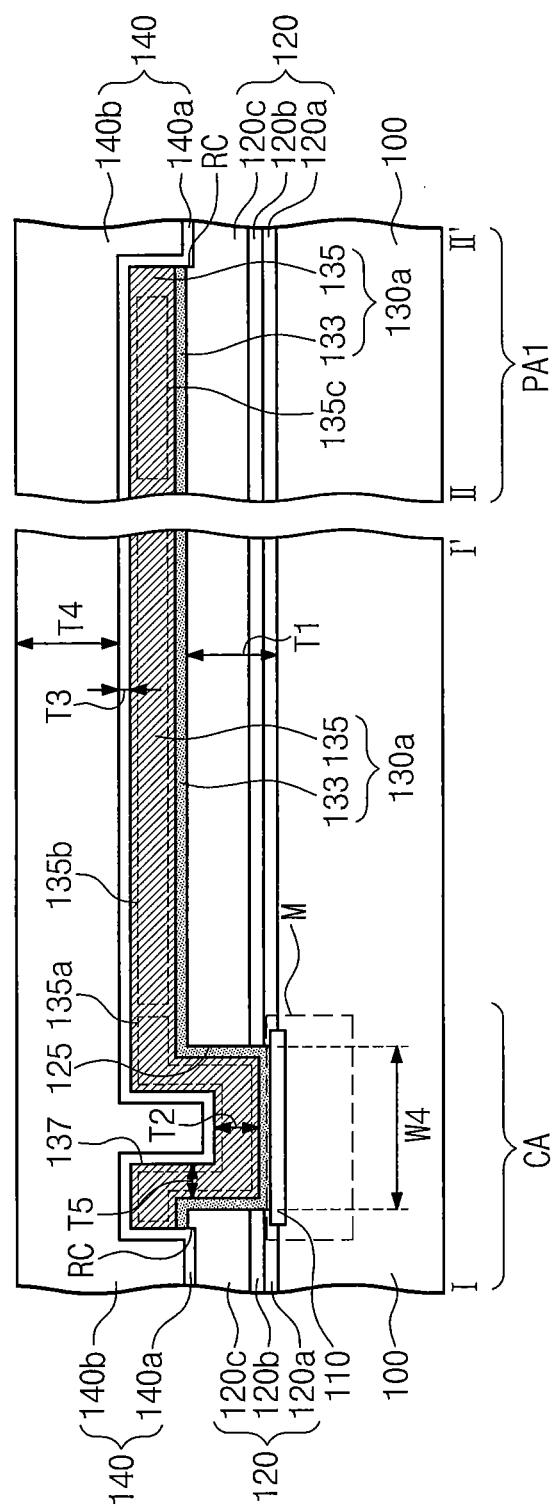

Referring to FIGS. 2 and 9, the second photoresist pattern PR remaining after the formation of the first redistribution interconnection 130a may be selectively removed. Thereafter, an upper insulating structure 140 may be formed on the first redistribution interconnection 130a and the lower insulating structure 120.

Forming the upper insulating structure 140 may include sequentially forming an upper insulating layer 140a and a polymer layer 140b on an entire top surface of the semiconductor substrate 100. The upper insulating layer 140a may be formed using an ALD process or a CVD process. The polymer layer 140 may be formed by coating a top surface of the upper insulating layer 140a with a polymer material, for example, polyimide, fluorocarbon, resin, or synthetic rubber, or a precursor of the polymer material. The upper insulating layer 140a may have a third thickness T3, and the polymer layer 140b may have a fourth thickness T4. The fourth thickness T4 may be greater than the third thickness T3.

Referring to FIGS. 2 and 3A, the upper insulating structure 140 may be patterned to form the first opening 145 exposing the bonding pad portion 135c. Patterning the upper insulating structure 140 may include forming a third photoresist pattern having an opening vertically overlapping with the bonding pad portion 135c, and etching the upper insulating structure 140 using the third photoresist pattern as an etch mask. The first opening 145 may have the third width W3. For example, the third width W3 may range from 100 μm to 300 μm. Thereafter, in a packaging process, a wire bonding process may be performed on the bonding pad portion 135c exposed through the first opening 145.

In the fabricating method according to some embodiments of the inventive concept, the redistribution interconnections 130 may be formed of an inexpensive metal, for example, aluminum, instead of gold or copper, thereby reducing a fabrication cost of the semiconductor chip or semiconductor package. Furthermore, since the redistribution interconnections 130 are formed using the deposition process and the patterning process instead of a plating process, general metal patterning equipment may be used to form the redistribution interconnections 130. Thus, processes of fabricating the semiconductor chip including the redistribution interconnections 130 may be efficiently managed.

Furthermore, in the fabricating method according to some embodiments of the inventive concept, the bonding pad portions 135c may be formed to be arranged in the zigzag pattern. Thus, it is possible to place a large number of the redistribution interconnections 130 and the bonding pad portions 135c corresponding thereto in a limited area.

Figure 10:
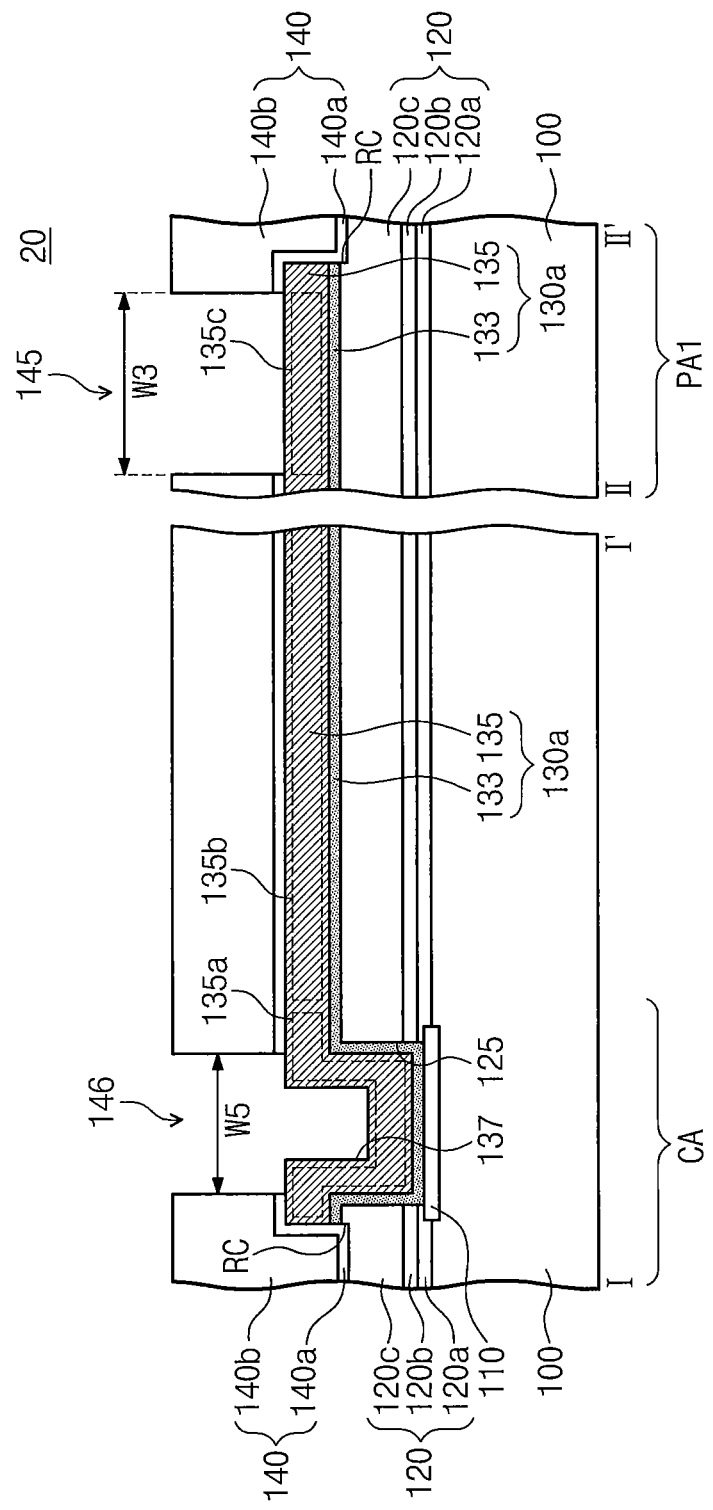
FIG. 10 is a cross-section taken along lines I-I' and II-II' of FIG. 2 illustrating a semiconductor chip according to some embodiments of the inventive concept.

FIG. 10 is a cross-section taken along lines I-I' and II-II' of FIG. 2 to illustrate a first semiconductor chip according to some embodiments of the inventive concept. In these embodiments, the detailed descriptions to the same technical features as in the embodiments of FIGS. 2 to 4B will be omitted or mentioned briefly for the purpose of ease and convenience in explanation. In other words, differences from embodiments of FIGS. 2 to 4B will be mainly discussed hereinafter.

Referring to FIGS. 2 and 10, a second opening 146 may penetrate the upper insulating structure 140 to expose the contact portion 135a. The second opening 145 may have a fifth width W5. For example, the fifth width W5 may range from 10 μm to 100 μm.

Even though not shown in the drawings, an additional external terminal may be connected to the contact portion 135a through the second opening 146. Thus, the contact portion 135a and the bonding pad 135c exposed through the first opening 145 may improve the degree of freedom of routing with respect to an external controller.

Figure 11:
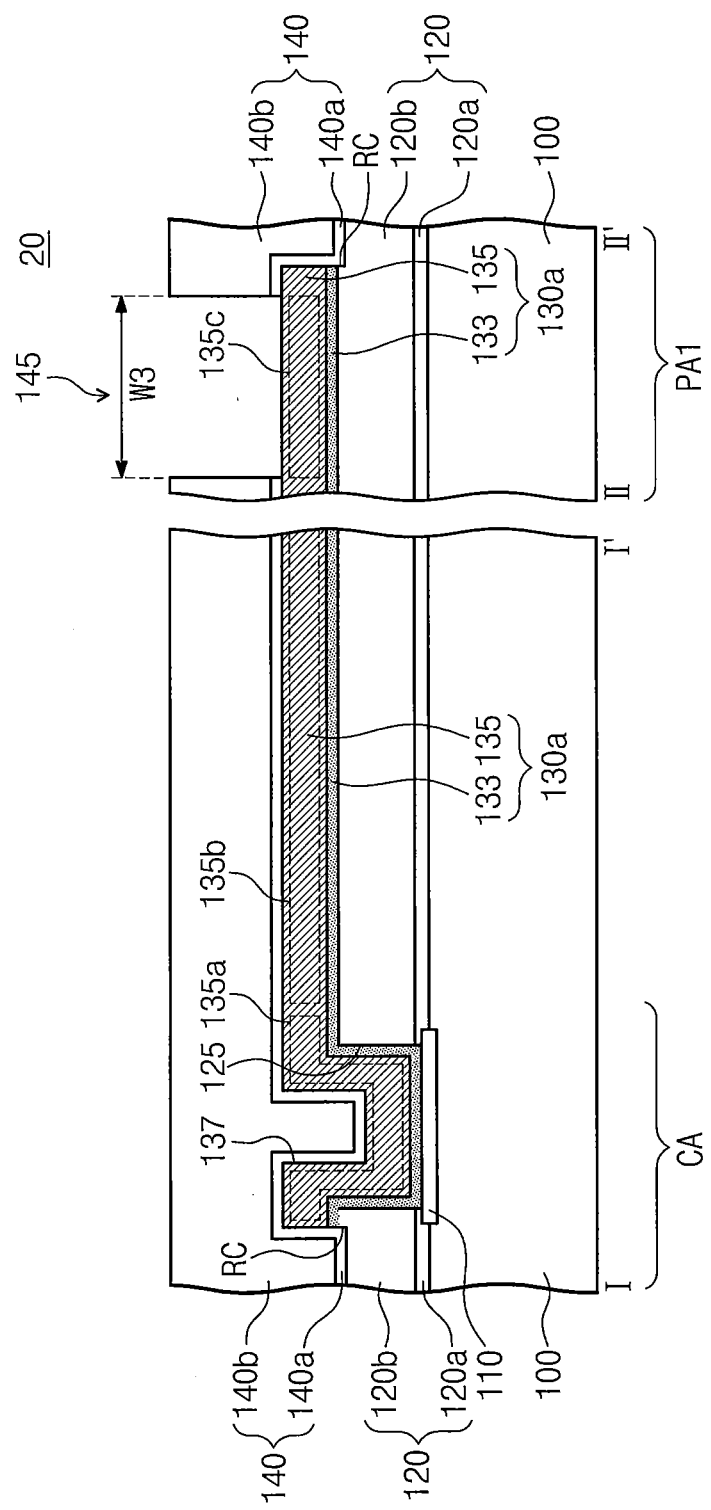
FIG. 11 is a cross-section taken along lines I-I' and II-II' of FIG. 2 illustrating a first semiconductor chip according to some embodiments of the inventive concept.

FIG. 11 is a cross-section taken along lines I-I' and II-II' of FIG. 2 to illustrate a first semiconductor chip according to some embodiments of the inventive concept. In these embodiments, the detailed descriptions to the same technical features as in the embodiments of FIGS. 2 to 4B will be omitted or mentioned briefly for the purpose of ease and convenience in explanation. In other words, differences from embodiments discussed above with respect to FIGS. 2 to 4B will be mainly discussed hereinafter.

Referring to FIGS. 2 and 11, a lower insulating structure 120 may include first and second lower insulating layers 120a and 120b sequentially stacked. Each of the first and second lower insulating layers 120a and 120b may be an inorganic insulating layer and may include, for example, a silicon nitride layer, a silicon oxide layer, or a silicon oxynitride layer. In some embodiments, the first lower insulating layer 120a may include a silicon nitride layer, and the second lower insulating layer 120b may include a silicon oxide layer.

Figure 12:
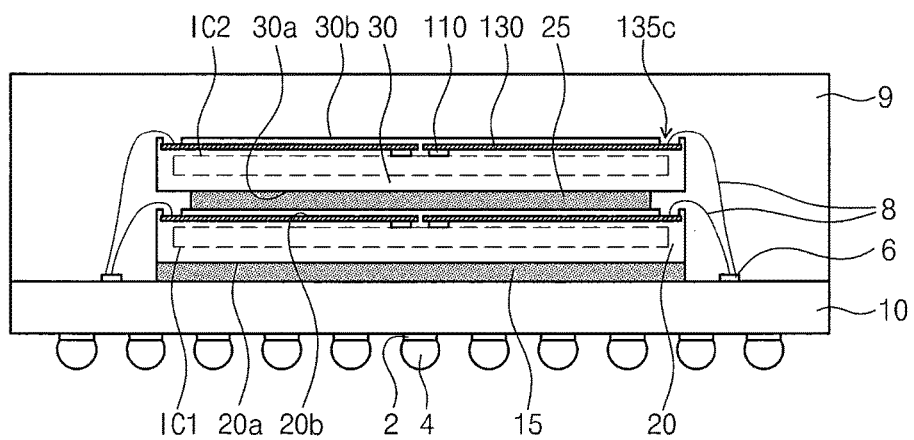
FIG. 12 is a cross-section illustrating a semiconductor package according to some embodiments of the inventive concept.

FIG. 12 is a cross-section illustrating a semiconductor package according to some embodiments of the inventive concept. In these embodiments, the detailed descriptions to the same technical features as in the embodiments of FIGS. 1 and 2 will be omitted or mentioned briefly for the purpose of ease and convenience in explanation. In other words, differences from embodiments of FIGS. 1 and 2 will be mainly discussed hereinafter.

Referring to FIG. 12, a first semiconductor chip 20 may be mounted on a package substrate 10, and a second semiconductor chip 30 may be mounted on the first semiconductor chip 10. The second semiconductor chip 30 may include a third surface 30a facing the first semiconductor chip 20 and a fourth surface 30b opposite to the third surface 30a.

The second semiconductor chip 30 may be the same or similar as the first semiconductor chip 20 discussed above. In some embodiments, the second semiconductor chip 30 may include a second integrated circuit IC2, pads 110, and redistribution interconnections 130. The redistribution interconnections 130 of the second semiconductor chip 30 may include bonding pad portions 135c. The second semiconductor chip 30 may be a memory chip such as a DRAM chip or a flash memory chip. The second integrated circuit IC2 may include memory cells for storing data and a control circuit and/or power circuit for controlling operations of the memory cells.

The second semiconductor chip 30 may adhere to the first semiconductor chip 20 by a second adhesive layer 25 interposed therebetween. The second adhesive layer 25 may include an epoxy, a silicon-based insulating layer, or a tape. A top surface of the second adhesive layer 25 may be disposed at a higher level than the topmost portions of the wires 8 connected to the first semiconductor chip 20.

Wires 8 may electrically connect the bonding pad portions 135c of the second semiconductor chip 30 to the second external pads 6 of the package substrate 10. The second semiconductor chip 30 may communicate with an external controller through the wires 8 connected to the second semiconductor chip 30.

A molding layer 9 may be disposed on the package substrate 10 to cover the first and second semiconductor chips 20 and 30 and the wires 8. The molding layer 9 may protect the first and second semiconductor chips 20 and 30 and the wires 8 from external environment.

In certain embodiments, one or more additional semiconductor chips may be sequentially stacked on the second semiconductor chip 30.

According to some embodiments of the inventive concept, since the redistribution interconnections of the semiconductor chip are formed using the deposition and patterning processes instead of a plating process, the fabrication cost of the semiconductor chip may be reduced. Furthermore, the bonding part portions of the redistribution interconnections may be arranged in the zigzag pattern, and thus a large number of the redistribution interconnections may be formed in a limited area.

While the inventive concept have been discussed with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. A semiconductor chip comprising:
    an integrated circuit on a substrate;
    pads electrically connected to the integrated circuit;
    a lower insulating structure defining contact holes exposing the pads, respectively; and
    first, second and third conductive patterns electrically connected to the pads,
    wherein the second conductive pattern is between the first conductive pattern and the third conductive pattern when viewed from a plan view;
    wherein each of the first to third conductive patterns comprises a contact portion filling the contact hole; a first conductive line portion extending in one direction on the lower insulating structure; and a bonding pad portion;
    wherein the contact portion has a first thickness in a direction perpendicular to a top surface of the substrate and a second thickness in a direction parallel to the top surface of the substrate, the first thickness being greater than the second thickness; and wherein ends of the bonding pad portions of the first and third conductive patterns protrude in the one direction as compared with an end of the bonding pad portion of the second conductive pattern when viewed from a plan view.

2. The semiconductor chip of claim 1:
wherein the bonding pad portions are adjacent to one sidewall of the semiconductor chip, and
wherein distances from the one sidewall to the bonding pad portions of the first and third conductive patterns are smaller than a distance from the one sidewall to the bonding pad portion of the second conductive pattern.

3. The semiconductor chip of claim 1:
wherein the second conductive pattern further comprises a second conductive line portion extending from the bonding pad portion in the one direction; and
wherein the bonding pad portion of the second conductive pattern is between the first conductive line portion and the second conductive line portion of the second conductive pattern.

4. The semiconductor chip of claim 1:
wherein the lower insulating structure includes a recess region in an upper portion thereof; and
wherein the recess region does not vertically overlap with the first to third conductive patterns.

5. The semiconductor chip of claim 4:
wherein a sidewall of the recess region is aligned with a sidewall of each of the first to third conductive patterns; and
wherein a bottom surface of the recess region is lower than a top surface of the lower insulating structure under the first to third conductive patterns.

6. The semiconductor chip of claim 1, wherein the contact portion fills the contact hole and defines a depressed region on the contact portion.

7. The semiconductor chip of claim 1:
wherein the pads are electrically connected to the integrated circuit through a plurality of metal layers and a plurality of vias, and
wherein the integrated circuit is under the plurality of metal layers and the plurality of vias.

8. The semiconductor chip of claim 1:
wherein the pads are in a central area of the semiconductor chip when viewed from a plan view, and
wherein the bonding pad portions of the first to third conductive patterns are in a peripheral area of the semiconductor chip when viewed from a plan view.

9. The semiconductor chip of claim 1, wherein the lower insulating structure includes a plurality of lower insulating layers sequentially stacked.

10. The semiconductor chip of claim 9, wherein each of the lower insulating layers includes one of a silicon nitride layer, a silicon oxide layer, and a silicon oxynitride layer.

11. The semiconductor chip of claim 1, further comprising:
an upper insulating structure defining first openings exposing the bonding pad portions of the first to third conductive patterns, respectively,
wherein the upper insulating structure comprises:
an upper insulating layer covering the lower insulating structure and the first to third conductive patterns; and
a polymer layer on the upper insulating layer.

12. The semiconductor chip of claim 11, wherein the upper insulating layer directly covers top surfaces and sidewalls of the first to third conductive patterns.

13. A semiconductor package comprising:
a package substrate; and
a semiconductor chip on the package substrate, the semiconductor chip electrically connected to the package substrate through wires, wherein the semiconductor chip comprises:
a first surface facing the package substrate;
a second surface opposite to the first surface;
pads adjacent to the second surface;
a lower insulating structure defining contact holes exposing the pads, respectively;
first, second and third conductive patterns electrically connected to the pads, each of the first to third conductive patterns comprising a contact portion filling the contact hole; a conductive line portion extending in one direction on the lower insulating structure; and a bonding pad portion being in contact with the wire; and
an upper insulating structure defining openings exposing the bonding pad portions, respectively,
wherein the lower insulating structure includes a recess region formed in an upper portion of the lower insulating structure;
wherein the recess region does not vertically overlap with the first to third conductive patterns;
wherein the second conductive pattern is between the first conductive pattern and the third conductive pattern when viewed from a plan view; and
wherein ends of the bonding pad portions of the first and third conductive patterns protrude in the one direction as compared with an end of the bonding pad portion of the second conductive pattern when viewed from a plan view.

14. The semiconductor package of claim 13, wherein the upper insulating structure comprises:
an inorganic insulating layer covering the lower insulating structure and the first to third conductive patterns, the inorganic insulating layer containing silicon; and
a polymer layer on the inorganic insulating layer.

15. The semiconductor package of claim 14, wherein the inorganic insulating layer directly covers a sidewall and a bottom surface of the recess region.

* * * * *